(12) United States Patent
Schönfeld et al.

(10) Patent No.: US 11,038,333 B2
(45) Date of Patent: Jun. 15, 2021

(54) CABLE FEEDTHROUGH

(71) Applicant: HARTING ELECTRIC GMBH & CO. KG, Espelkamp (DE)

(72) Inventors: Alexander Schönfeld, Osnabrück (DE); Wilhelm Kliever, Minden (DE); Heinrich Friesen, Minden (DE); Christof Hermoni, Espelkamp (DE)

(73) Assignee: HARTING Electric GmbH & Co. KG, Espelkamp (DE)

( * ) Notice: Subject to any disclaimer, the term of this patent is extended or adjusted under 35 U.S.C. 154(b) by 0 days.

(21) Appl. No.: 16/762,103

(22) PCT Filed: Nov. 14, 2018

(86) PCT No.: PCT/DE2018/100930
§ 371 (c)(1),
(2) Date: May 6, 2020

(87) PCT Pub. No.: WO2019/101268
PCT Pub. Date: May 31, 2019

(65) Prior Publication Data
US 2020/0358276 A1    Nov. 12, 2020

(30) Foreign Application Priority Data
Nov. 24, 2017   (DE) .................. 10 2017 127 774.9
Dec. 14, 2017   (DE) .................. 10 2017 129 923.8

(51) Int. Cl.
*H02G 3/22* (2006.01)
*H05K 5/02* (2006.01)
*H05K 5/03* (2006.01)

(52) U.S. Cl.
CPC ............. *H02G 3/22* (2013.01); *H05K 5/0217* (2013.01); *H05K 5/0247* (2013.01); *H05K 5/03* (2013.01)

(58) Field of Classification Search
None
See application file for complete search history.

(56) References Cited

U.S. PATENT DOCUMENTS

| 7,066,677 B2 * | 6/2006 | Ruter ............... H01R 13/516 403/231 |
| 7,556,523 B2 * | 7/2009 | Mossner ........... H01R 13/447 439/456 |

(Continued)

FOREIGN PATENT DOCUMENTS

| CN | 104221236 A | 12/2014 |
| DE | 197 23 032 C1 | 10/1998 |

(Continued)

OTHER PUBLICATIONS

International Preliminary Report on Patentability dated May 26, 2020 for International Application No. PCT/DE2018/100930, 5 pages.

(Continued)

*Primary Examiner* — Xanthia C Cunningham
(74) *Attorney, Agent, or Firm* — Seed IP Law Group LLP

(57) ABSTRACT

A cable feedthrough for feeding at least one cable into a housing with an opening is provided. The cable feedthrough includes a covering comprising at least two housing shells, the covering having at least one opening, wherein a separating plane of the housing shells extends centrally through the opening, wherein to seal the housing, at least one elastic and/or flexible sealing element is provided that comprises a cable passage with a slit extending to the lateral edge of the cable passage, and wherein a counter pressure plate is provided that comprises at least one cable passage and covers the opening, the counter pressure plate cooperating with the sealing element and the covering to seal the housing. The sealing element is arranged with a predetermined oversize between the covering and the counter pres- (Continued)

sure plate and is under pressing force, as a result of which the sealing element is compressed.

13 Claims, 6 Drawing Sheets

(56) References Cited

U.S. PATENT DOCUMENTS

| | | | | |
|---|---|---|---|---|
| 9,121,244 | B2* | 9/2015 | Loretz | F16K 11/0655 |
| 2007/0155252 | A1* | 7/2007 | Ferderer | H01R 13/506 |
| | | | | 439/680 |
| 2008/0073120 | A1* | 3/2008 | Drotleff | H02G 15/013 |
| | | | | 174/77 R |
| 2011/0108085 | A1* | 5/2011 | Quiter | H02S 40/34 |
| | | | | 136/244 |
| 2014/0116551 | A1* | 5/2014 | Smith | F16K 11/04 |
| | | | | 137/625.69 |
| 2014/0182928 | A1* | 7/2014 | Starke | H02G 3/22 |
| | | | | 174/559 |
| 2016/0033722 | A1* | 2/2016 | Ray | G02B 6/4446 |
| | | | | 385/135 |
| 2018/0073652 | A1* | 3/2018 | Weintraub | F16K 11/0655 |
| 2018/0254577 | A1* | 9/2018 | Herbrechtsmeier | H01R 13/514 |
| 2018/0277978 | A1* | 9/2018 | Schonfeld | H01R 13/518 |
| 2019/0237901 | A1* | 8/2019 | Schoenfeld | H01R 13/5208 |
| 2019/0237954 | A1* | 8/2019 | Ferderer | H02G 3/0418 |

FOREIGN PATENT DOCUMENTS

| | | |
|---|---|---|
| DE | 299 11 305 U1 | 12/1999 |
| DE | 10 2006 062 609 A1 | 7/2008 |
| DE | 10 2010 046 857 B3 | 12/2011 |
| DE | 10 2014 003 038 A1 | 9/2015 |
| EP | 0 901 190 A2 | 3/1999 |
| JP | S57-161282 U | 10/1982 |

OTHER PUBLICATIONS

European Patent Office, International Search Report for international application No. PCT/DE2018/100930, dated Feb. 19, 2019, 12 pages (with English translation).
German Patent Office, Office Action for German application No. 10 2017 129 923.8, dated Dec. 4, 2018, 7 pages.
Chinese Office Action dated Nov. 17, 2020, for Chinese Application No. 201880075346.4, 7 pages.

* cited by examiner

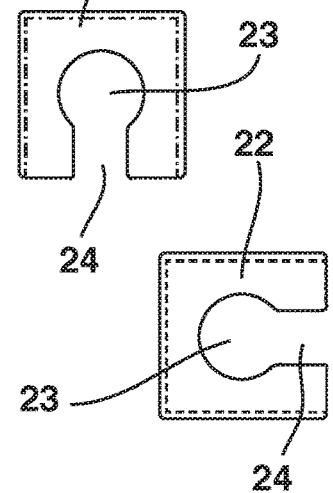

CABLE FEEDTHROUGH

BACKGROUND

Technical Field

This disclosure relates to a cable lead-through of an electrical cable, in particular a prefabricated electrical cable. In this case, the disclosure moreover relates, in particular, to a cable lead-through into a housing, which cable lead-through is provided with a seal.

Description of the Related Art

By way of example, DE 10 2006 062 609 A1 discloses a very comprehensive overview of cable lead-throughs for electrical cables, wherein, in multiple ways, a cable is firstly led through a cable lead-through provided in a housing wall and the cable is then conventionally attached to a plug, for example, by soldering.

However, this is relative laborious and still necessitates the additional operating step of attaching the plug after the leading-through of the cable. Furthermore, for cables with prefabricated plugs, the plugs have to be removed for installation, which involves complex handling and is therefore costly.

In this regard, the cable lead-through of DE 10 2006 062 609 A1 is an example of the type in which pressure is applied to a seal by means of a screw gland for sealing purposes.

EP 0 901 190 A2 attempts to eliminate the said disadvantages and provides a cable lead-through, equipped with a seal, for leading a cable which is prefabricated with a plug into a housing in which an aperture for leading through a plug is provided in a wall of the housing. In this case, the aperture is covered by a lid, which is divided into two parts and can be assembled with passages for one or more cables, into which a block-shaped and flexible and/or elastic insert having a cable insertion hole can be inserted, which cable insertion hole has a slot to its insertion edge. The insert realizes a pressing force with the hood and the housing wall so that a sealed connection is provided.

The slot of the block-shaped insert permits the cable to be inserted into the cable insertion hole. Since the insert is formed in a block shape and is only subjected to a merely axial pressing force (with respect to the insertion hole) by the housing and wall at its edge, the slot of the insert for ensuring the sealing action is formed in a zigzag shape. Moreover, in this case, the dimensions of the aperture are restricted considerably, in particular with regard to its width. Also in the case of a plurality of inserts, wedge-shaped molded portions, which are formed only at the edge of an insert and cooperate with the lid, merely bring about a pressing force on the edge of an adjacent insert and therefore have no influence on the sealing of the lid, the slot and the insertion hole with the cable.

The zigzag-shaped slot of the insert moreover requires very laborious and therefore costly handling during the insertion of the cable, since, in this case, the insert must be opened at the slot both axially to the top and bottom and radially, which is time-consuming and therefore costly. Moreover the cable lead-through of EP 0 901 190 A2 is only suitable for an aperture with restricted dimensions owing to the elasticity of the insert elements.

A combination of the cable lead-through according to EP 0 901 190 A2 and DE 10 2006 062 609 A1 results in a solution which eliminates none of the above disadvantages, especially since, in the case of DE 10 2006 062 609 A1, pressure is exerted on a sealing element by means of the screw gland. In this case, undesired shear forces namely occur, which, in particular, have a disadvantageous effect on the insert provided with a slot according to EP 0 901 190 A2 and the intended function thereof.

BRIEF SUMMARY

Embodiments of the present invention provide a cable lead-through which is easy to handle and install, and therefore also cost-effective, in particular for leading prefabricated electrical cables in particular into a housing. Embodiments of the present invention further provide a corresponding cable lead-through equipped with a reliable seal, which is moreover suitable for a multitude of different housings and cables.

Embodiments of the present invention in this case comprise, in particular, a cable lead-through for leading at least one cable into a housing having an opening, which is equipped with a cover comprising at least two housing shells and having at least one opening. In this case, the separating plane of the housing shells extends centrally through the opening of the cover and, to seal the housing, at least one elastic and/or flexible sealing element is provided, which comprises a cable passage having a slot to its lateral edge. A counter pressure plate comprising at least one cable passage and covering the opening of the housing is moreover provided, which cooperates with the sealing element and the cover to seal the housing, wherein the sealing element is arranged with a predetermined oversize between the cover and the counter pressure plate and is therefore subjected to a pressure force so that the sealing element, under a corresponding compression, provides the sealing, in particular, of the cable, the cover and its slot without a shear force occurring.

The provision of the counter pressure plate covering the opening of the housing is particularly advantageous since the counter pressure plate counteracts the pressing force over the entire opening, in particular also in its central region, so that effective sealing is provided over the entire opening by means of the sealing element. Moreover, owing to the provision of the counter pressure plate, the opening of the housing is not restricted in terms of its dimensions, so that access for a plurality of cables prefabricated with plugs of sizeable dimensions into the interior of the housing is ensured. The cable lead-through according to embodiments of the invention can therefore be adapted and handled flexibly for a plurality of different housings and cables.

In this case, for manageable insertion of the cable after the intended positioning of the cable in the housing has taken place, the cable passage of the counter pressure plate can, in a suitable manner, comprise at least one continuous opening and at least one lateral cable inlet for lateral insertion of the cable into the opening.

Furthermore, the counter pressure plate can, in a suitable manner, be supported in the vicinity of the opening of the housing on a support formed on the inside of a wall of the housing, which support can be a projection which projects into the interior of the housing by a predetermined amount so that stable positioning of the counter pressure plate on the support is provided and, in this case, the access into the interior of the housing through its opening is moreover not impaired. Instead of the projection, the support can also be formed as a step on a wall of the housing. For stable positioning of the counter pressure plate in the housing and the cover on the housing, an edge of the housing, which surrounds the opening, can, in this case, project in a suitable manner beyond the counter pressure plate.

In this case, the counter pressure plate can, in particular, be advantageously formed in one piece, whereby it is particularly easy to handle and is moreover particularly stable with respect to a pressure acting, in particular, on its central region.

According to a modification of the above embodiment, the counter pressure plate can be formed in two pieces and be assembled from two substantially identically formed half plates, whereof the separating plane extends centrally through the opening of the counter pressure plate. In this case, such a two-piece counter pressure plate is formed with a corresponding depth (thickness) to provide a stable counter pressure, in particular in the region of its separating plane. In the region of the separating plane, the half plates can also have a mutually corresponding stepped form, whereby the stability of a correspondingly assembled counter pressure plate is likewise increased.

According to a further modification, the counter pressure plate can be formed such that it can be assembled from a plurality of individual, substantially identically formed plate elements, each having at least one cable passage for receiving a cable. In this case, an edge of a plate element which corresponds in each case to an intended adjacent plate element can, in a suitable manner, have a contour corresponding to the edge of the adjacent plate element, wherein the contours can be formed to correspond in the manner of a dovetail or in the manner of a rail, so that a desirable cohesion of the plate elements assembled to form the counter pressure plate is provided.

The opening of the cover of the housing, starting from its edge, can be particularly advantageously internally widened in a cone shape, whereby a contour is provided, which cooperates with the sealing element in such a way that the sealing element undergoes an axial and radial compression under the pressing force, without undesired shear forces thereby occurring. As a result of this measure, particularly effective and reliable sealing between the cable, the sealing element and the cover is achieved, and the slot of the sealing element is moreover closed in a desirably sealed manner.

In this case, suitable measures can be provided for fixing the cover on the housing in a stable manner and for combining the housing shells in a stable manner to form the cover. In a suitable manner, the housing and the cover and the housing shells can be formed such that they can be latched together for this purpose. The cover and the housing can also be screwed together, for which suitable bores can be provided in the housing and in the cover.

A cable which has already been positioned as intended in the housing can also be inserted in a simple manner between the two separate housing shells into the opening of the cover consisting of the two housing shells, whereupon the two housing shells are assembled to form the cover with the cable inserted into the opening thereof. In this case, the sides of the two housing shells which correspond to the separating plane of the housing shells can each be formed in a suitable manner as mutually corresponding contours, which engage with one another with form fit in such a way that the cover is also sealed in the region of the separating plane of its housing shells.

The sealing element can advantageously comprise a first cylinder having a first diameter and a second cylinder having a second diameter that is smaller than the first diameter, wherein the cable passage is formed axially through the first and second cylinder and the slot advantageously extends to the lateral edge of the sealing element in the longitudinal direction through the first and second cylinder. The sealing element can thus be handled particularly easily, since it is suitably designed for a cable already positioned in the housing to be inserted into its cable passage via simple lateral insertion, merely by opening its slot radially in an easily manageable manner, whereby the cable passage is exposed. The advantageous design of the slot in the longitudinal direction is, in particular, possible since, as mentioned at the outset, an advantageous compression of the sealing element is provided by means of the cable lead-through according to embodiments of the invention, without the occurrence of undesired shear forces which could impair the sealing of the slot.

The first cylinder of the sealing element can be supported in a suitable manner against the counter pressure plate and can be advantageously formed such that it is rounded in the vicinity of the opening of the cover, whereby the sealing element cooperates particularly advantageously with the conically widened opening of the cover described above, so that the sealing element undergoes axial and radial compression under the axial pressing force.

For simple handling and installation, the second cylinder of the sealing element can be arranged in a suitable manner in the opening of the counter pressure plate such that it is in form fit with said opening, whereby the sealing element is moreover positioned in a stable manner on the counter pressure plate.

The housing of a cable lead-through described above can be made from plastic and/or metal and the cover can be made in a suitable manner from plastic since the cover is assembled from two housing shells corresponding with form fit. The counter pressure plate can be formed in a suitable manner from metal with a predetermined depth (thickness) in order to desirably counteract a pressing force described above. The sealing element is preferably formed in one piece from a suitable flexible and/or elastic sealing material, wherein the sealing element can also be formed as a filler plug without the cable passage and the slot.

Inventive embodiments of the cable lead-throughs described above are, in particular, suitable for at least one prefabricated electrical cable, which can be fitted with a plug, wherein it is desirable, in particular, to position the plug as intended in the housing prior to installing the cable lead-through.

A cable lead-through according to an embodiment of the invention can moreover be designed for a plurality of cables.

As described above, a cable lead-through according to one or more embodiments of the invention can be handled and installed in a simple manner and is therefore also cost-effective and enables reliable sealing and flexible use with a plurality of differently formed cables and housings.

BRIEF DESCRIPTION OF THE SEVERAL VIEWS OF THE DRAWINGS

Exemplary embodiments of the invention are illustrated in the drawings and will be explained in more detail below.

FIG. 3b shows a modification of the sealing element of FIG. 3a;

FIG. 6b shows an enlarged illustration of the detail A1 of a section along the line SL-SL of FIG. 6a;

The figures may contain partially simplified schematic illustrations. Identical reference signs are sometimes used for elements which are similar, but possibly not identical. Varying views of similar elements could be drawn to different scales.

DETAILED DESCRIPTION

Figure 1:
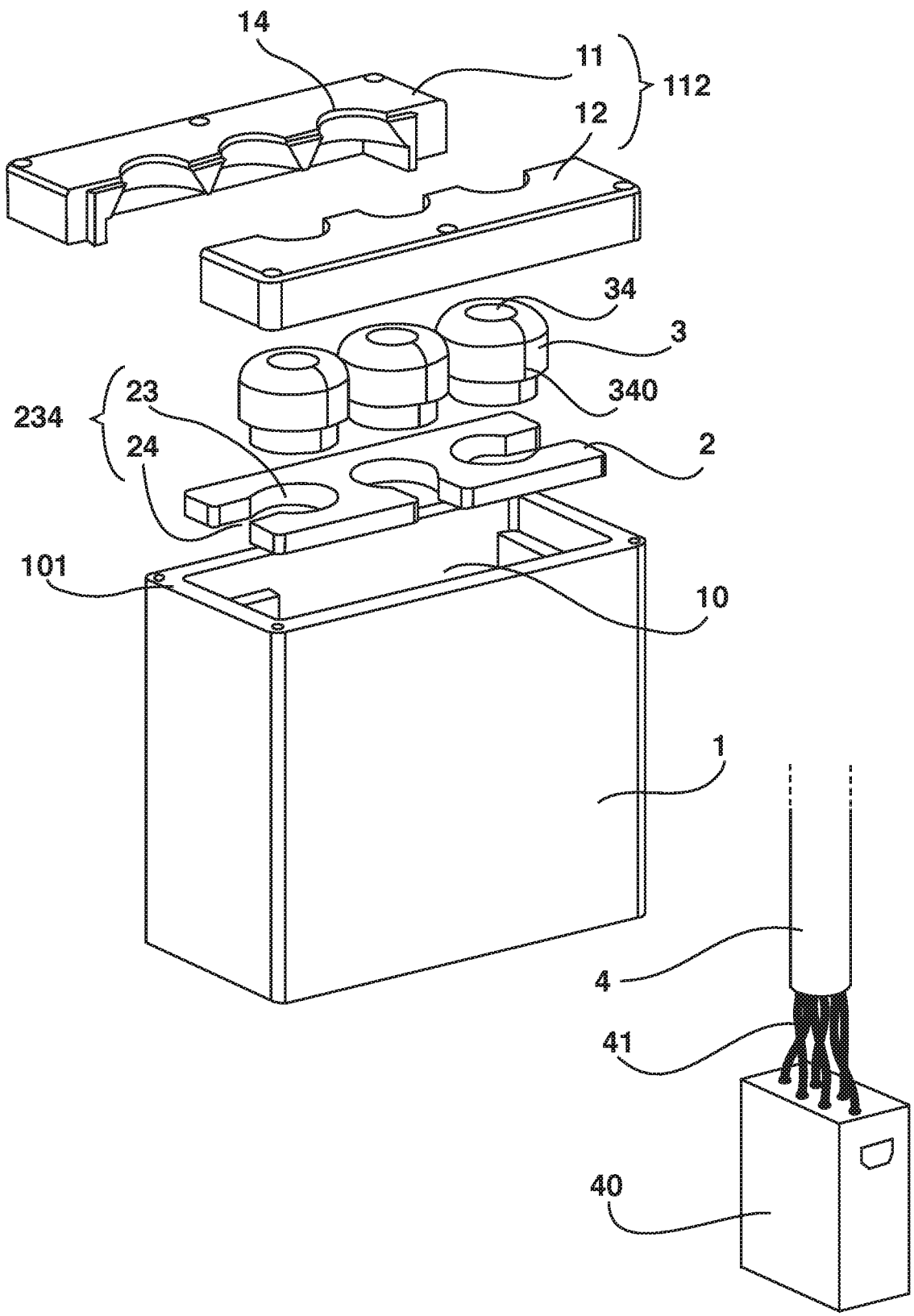
FIG. 1 shows a perspective exploded illustration of a cable lead-through of an embodiment of the invention with a housing with a cover, a counter pressure plate and sealing elements and with a prefabricated cable.

A perspective exploded illustration of a cable lead-through according to an embodiment of the invention, having a housing 1 with a cover 112, a counter pressure plate 2 and a plurality of sealing elements 3 together with a suitable prefabricated cable 4, is shown in FIG. 1 using only few reference signs for reasons of clarity. A detailed description of the above elements with further reference signs follows with reference to FIGS. 2a to 2c and FIGS. 3a to 3d.

The prefabricated cable 4 comprises a plurality of stranded wires 41, which are connected to a plug 40, and is suitable for the cable lead-through of FIG. 1. A detailed description of the installation of the cable lead-through with the cable 4 follows with reference to FIGS. 4a to 4d and FIGS. 5a to 5d and FIG. 6a.

The housing 1 comprises an upper opening 10, which enables access into the interior of the housing 1 and is suitable for positioning the prefabricated cable 4 with its plug 40 as intended in the housing 1 in a simple manner. The housing 1 moreover comprises a cover 112 assembled from two housing shells 11, 12, which has a plurality of openings 14 for receiving a cable 4 already positioned in the housing 1 and further cables 4, wherein a cover 112 which is assembled and seated on the opening 10 closes the opening 10 of the housing 1.

A support 102 for the counter pressure plate 2 is provided within the housing 1, in the vicinity of the opening 10. The counter pressure plate 2 comprises a cable passage 234 with a cable inlet 24 and an opening 23, which enable a cable 4 already positioned as intended in the housing 1 to be received.

A sealing element 3 made from flexible and/or elastic material comprises an axial cable passage 34 with a slot 340 which, starting from the cable passage 34, extends to a lateral edge of the sealing element 3. The sealing element 3 is thus suitably formed to receive a cable 4, already positioned as intended in the housing 1, by lateral insertion of said cable 4 through the slot 340 into its axial cable passage 34. A sealing element 3 arranged between the cover 112 and the counter pressure plate 2 is moreover formed with a predetermined oversize in relation to the cover 112 seated on the housing 1 and the counter pressure plate 2 inserted into the housing 1, wherein it engages partially with the opening 23 of the counter pressure plate 2 with form fit, and a predetermined pressing and sealing connection between the cable 4, sealing element 3, counter pressure plate 2 and cover 112 is moreover provided.

Figure 2A:
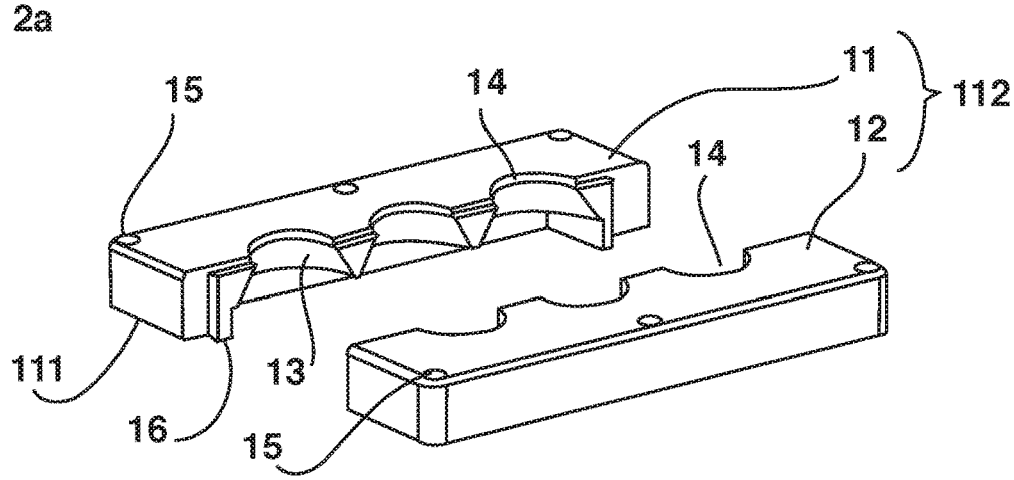
FIG. 2*a* shows the cover of FIG. 1.

FIG. 2a shows the shell-like cover 112 of the housing 1 with its two housing shells 11 and 12, whereof the separating plane extends centrally through the openings 14 for leading through the cable 4. The openings 14 of the cover 112, starting from the edge of the openings 14 having the contour 13, are internally widened in a cone shape in order to suitably cooperate with sealing elements 3, which are described below with reference to FIGS. 3a and 3b. To attach the assembled cover 112, which is seated with its lower edge 111 on the edge 101 of the housing 1, to the housing 1, the cover 112 comprises bores 15 which are suitable for screws.

In a suitable manner, the sides of the two housing shells 11 and 12 which correspond in terms of their separating plane, are each formed as mutually corresponding contours 16, which engage with one another with form fit in such a way that the cover 112 is also sealed in the region of the separating plane. To provide a particularly reliable seal for the two housing shells 11 and 12, the cover 112 is formed from a suitable plastic for this. Additionally or alternatively, the cover 112 in this case can comprise a further cord-like sealing element in the region of its separating plane.

Figure 2B:
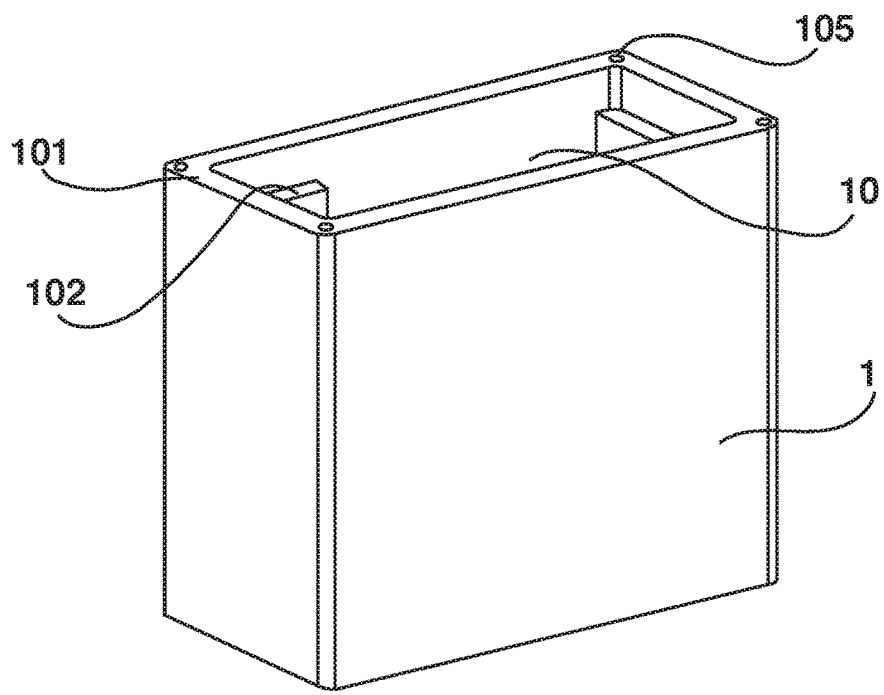
FIG. 2*b* shows the housing of FIG. 1.
Figure 2C:
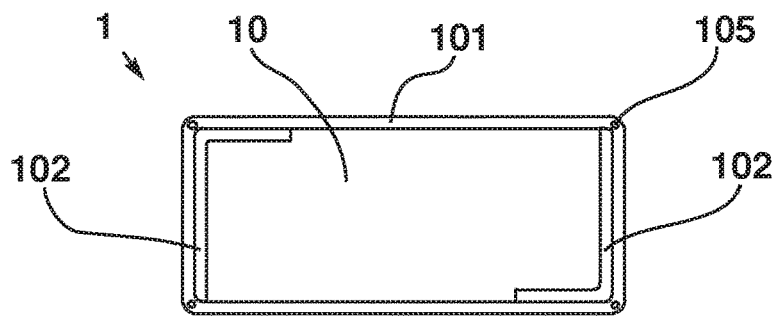
FIG. 2*c* shows the housing of FIG. 1 from above.

FIG. 2b shows the housing 1 of FIG. 1 with the opening 10 and a support 102 for the counter pressure plate 2, and FIG. 2c shows a plan view of the housing 1 of FIG. 2b from above. The opening 10 has the edge 101 for seating the cover 112, which corresponds to the edge 111 of the cover 112. Bores 105 are provided in the edge 101 of the housing 1 for fixing the cover 112 by way of screws, which bores correspond to the bores 15 of the cover 112. A suitable support 102 for the counter pressure plate 2 is furthermore provided in the vicinity of the opening 10 in the housing 1. To this end, the support 102 of the embodiment of FIGS. 1 and 2 is formed, by way example, as two steps, which each extend over two opposite walls of the housing 1 and which continue partially on walls which are adjacent to these walls and are likewise opposite one another.

The support 102 of the embodiment of FIGS. 2b and 2c can also be formed as a projection which, starting from the wall of the housing 1, extends by a predetermined amount into the interior of the housing 1 so that stable positioning of the counter pressure plate 2 on the support 102 is provided and, in this case, the access into the interior of the housing 1 through the opening 10 is, moreover, not impaired during the insertion of the prefabricated cable 4. The support 102 of the embodiment of FIGS. 2b and 2c is particularly suitable for the counter pressure plate 2, formed in one piece, of the embodiment of FIGS. 1 and 3c.

Figure 3A:
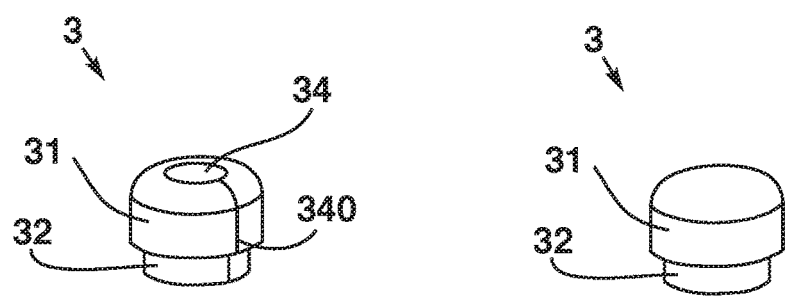
FIG. 3*a* shows embodiments of an individual sealing element of the embodiment of FIG. 1.

FIG. 3a shows an embodiment of a sealing element 3 of FIG. 1 together with a sealing element 3 formed as a filler plug, which substantially comprise a first cylinder 31 having a first diameter on a second cylinder 32 having a second smaller diameter. The sealing element 3 comprises the axial cable passage 34, from which the lateral slot 340 extends to the lateral edge of the sealing element 3 in the longitudinal direction through the first 31 and second 32 cylinder. The elastic and/or flexible sealing element 3 can be opened in a simple manner, merely radially with respect its axis, via the slot 340 and the cable passage 34 can thus be exposed for lateral insertion of the cable 4. For suitable cooperation with the cone 13 of the inner contour of the cover 112, the first cylinder 31 is formed such that it is rounded at the top in the vicinity of its opening 14, which is also described below with reference to FIGS. 6b and 6c.

Figure 3B:
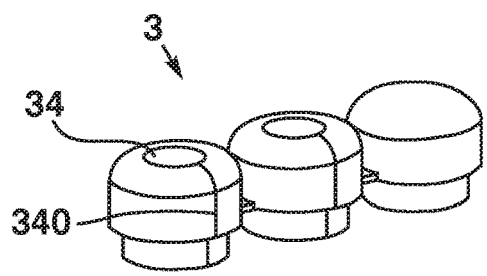

FIG. 3b shows three sealing elements 3, which are formed according to the embodiment of FIG. 3a and, unlike the individual sealing elements 3 of FIG. 3a, are connected to one another at the lower edge of the first cylinder 31 via a flat connection, wherein, by way of example, one sealing element 3 can be formed as a filler plug. The connection of the sealing elements 3 merely at the lower edge of their first cylinder 31 ensures that the sealing elements 3 are not impaired in terms of their intended function by the connection.

Figure 3C:
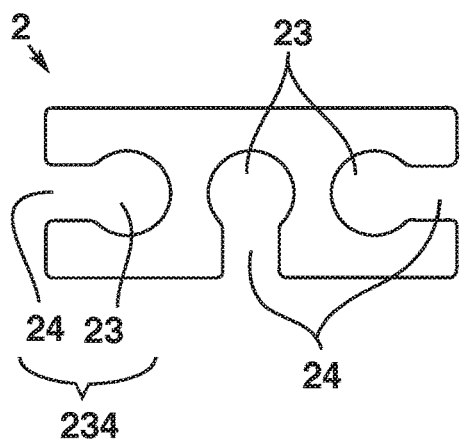
FIG. 3c shows the counter pressure plate of FIG. 1 from above.
Figure 3E:
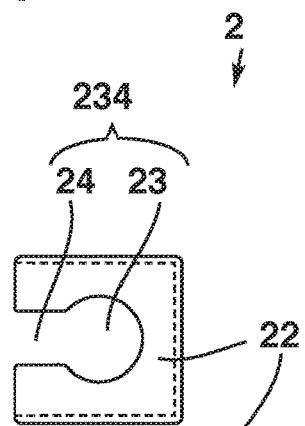
FIG. 3e shows a further modification of the counter pressure plate of FIG. 3c.
Figure 3D:
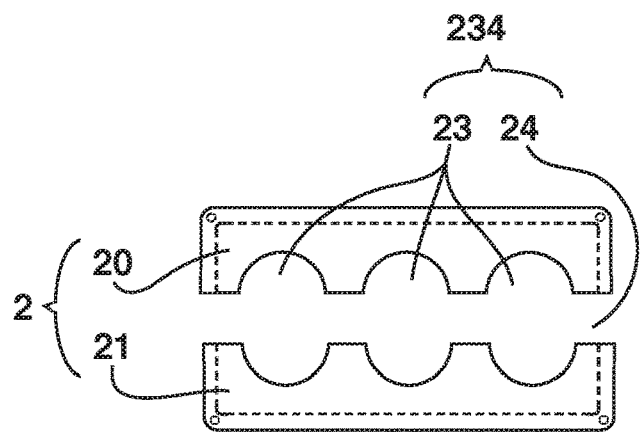
FIG. 3d shows a modification of the counter pressure plate of FIG. 3c.

FIG. 3c shows the counter pressure plate 2 of FIG. 1 from above and FIG. 3d a modification of the counter pressure plate 2 of FIG. 3c, which are formed substantially two-dimensionally with a predetermined depth.

The counter pressure plate 2 of FIG. 3c comprises the cable passages 234, each with a lateral cable inlet 24 and an opening 23, which enable a cable 4 which is already positioned as intended in the housing 1 to be received. In this case, the cable inlets 24, starting from the openings 23, each extend to a lateral edge of the counter pressure plate 2, so that the openings 23 are accessible for the lateral insertion of a cable 4 via the cable inlets 24. The counter pressure plate 2 of FIG. 3c is advantageously formed in one piece and is particularly suitable for the embodiment of the housing 1 with the support 102 of FIGS. 2b and 2c.

The counter pressure plate 2 of FIG. 3d corresponds, with its openings 23, to the embodiment of FIG. 3c and, unlike the counter pressure plate 2 of FIG. 3c, is formed in two pieces like the cover 112 and is assembled from two substantially identically formed half plates 20, 21 whereof the separating plane extends centrally through the openings 23. In this case, the counter pressure plate 2 has a cable passage 234 with a common cable inlet 24 for all openings 23, which is closed when its two half plates 20, 21 are assembled. The counter pressure plate 2 of FIG. 3d is likewise suitable for the embodiment of the housing 1 with the support 102 of FIGS. 2b and 2c, wherein, for particularly stable and secure support, a correspondingly modified housing 1 can also comprise a fully circumferential closed support 102 at its inner walls. The counter pressure plate 2 of FIG. 3d is moreover particularly suitable for the embodiment of the sealing elements 3 of FIG. 3b.

The counter pressure plate 2 of the embodiment of FIG. 3e comprises three individual plate elements 22, each provided with a cable passage 234, which can be assembled to form the counter pressure plate 2 corresponding substantially to the counter pressure plate 2 of FIG. 3c. The three plate elements 22, with their cable inlet 24 and their opening 23, are formed substantially identically. In this case, the edges associated with the adjacent plate elements 22 in each case can, in a suitable manner, have mutually corresponding contours. This option is shown in FIG. 3e by dashed lines in each case. In this case, the edges of the plate elements 22 can, by way of example, be designed to correspond in the manner of a dovetail or in the manner of a rail, so that desirable cohesion of the plate elements 22 assembled to form the counter pressure plate 2 is provided. Like the counter pressure plate 2 of FIG. 3d, the counter pressure plate 2 of FIG. 3e is likewise suitable for the embodiment of the housing 1 with the support 102 of FIGS. 2b and c, wherein, for particularly stable and secure support, a correspondingly modified housing 1 can also comprise a fully circumferential closed support 102 at its inner walls.

As described above with reference to FIG. 1, the sealing element 3 undergoes a pressing and sealing connection, wherein the counter pressure plate 2 is formed to be sufficiently stable to provide a counter pressure on the sealing element 3, for which the material and the depth of the counter pressure plate 2 are also determined. To keep the required depth of the counter pressure plate 2 as small as possible, the counter pressure plate 2 is formed in a suitable manner from metal and the depth of the counter pressure plate 2 of the embodiment of FIG. 3d is increased compared to the embodiment of FIG. 3c in order to counteract a pressure in particular in the region of the separating plane of its half plates 20, 21. In this case, the region of the separating plane of the half plates 20, 21 can also have a mutually corresponding stepped form, whereby the stability of a correspondingly assembled counter pressure plate 2 is likewise increased in the region of the assembled stepped portions.

The counter pressure plate 2 of FIG. 3d can also be dimensioned in such a way that it is supported directly on the edge 101 of the opening 10 of the housing 1, wherein the counter pressure plate 2 can comprise a respective step, contour or profile at its edge, which corresponds with form fit to the edge 101 of the housing 1 and/or the edge 111 of the cover 112. This option is indicated by the dashed line in FIG. 3d. Of course, in this case, further sealing measures can also be realized between the housing 1, counter pressure plate 2 and cover 112 at their edges. Moreover, a counter pressure plate 2 of this type can also comprise bores, which correspond to the bores 15 and 105 of the cover 112 and housing 1.

Figure 4A:
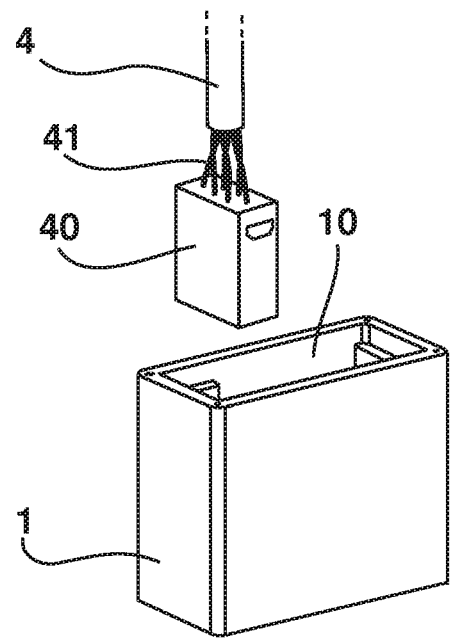
FIGS. 4a to 4d show steps in the installation of the cable lead-through of FIG. 1.
Figure 4B:
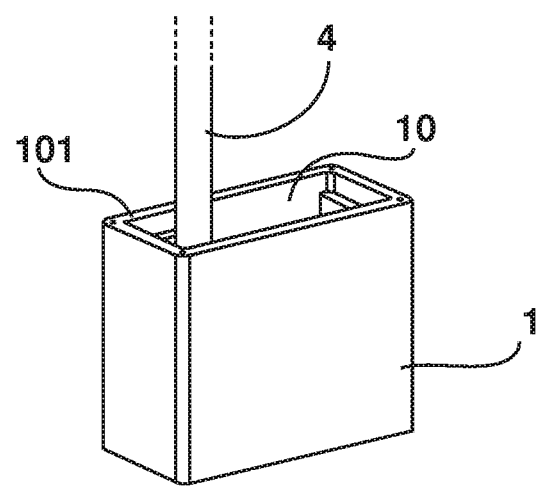

FIGS. 4a to 4d show steps during the installation of the cable lead-through of FIG. 1, merely based on the example of one prefabricated cable 4, wherein, in FIG. 1, the cable 4 is fitted with a plug 40 on its stranded wires 41 and is inserted into the opening 10 of the housing 1 from above. In FIG. 4b, the plug 40 and the cable 4 are positioned in their predetermined position in the housing 1. In this case, the cable 4 projects out of the housing 1.

Figure 4C:
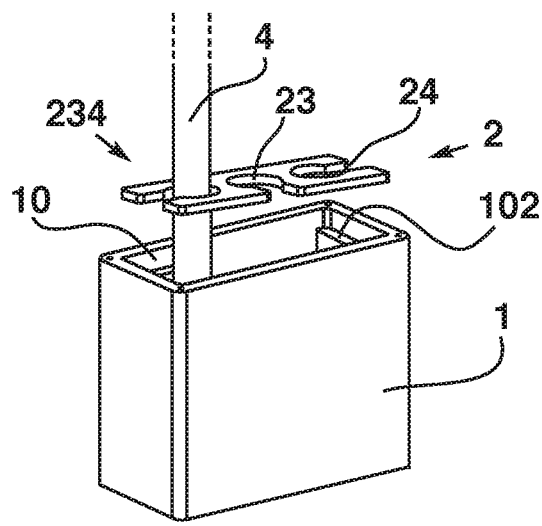
Figure 4D:
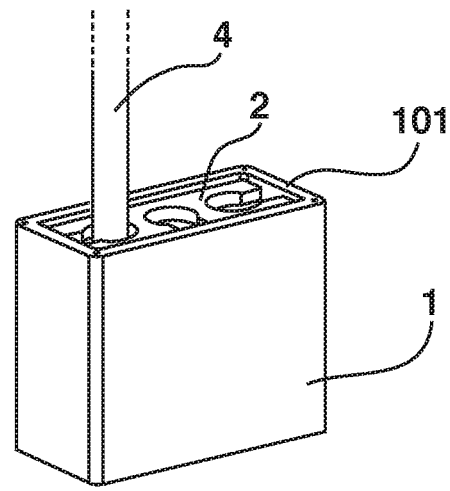

FIG. 4c shows the cable 4 inserted into an opening 23 of the counter pressure plate 2 of FIGS. 1 and 3c via a cable inlet 24 of a cable passage 234 outside the housing 1, and FIG. 4d shows the counter pressure plate 2 inserted as intended into the housing 1, on the support 102. In this case, the counter pressure plate 2 is arranged in the vicinity of the opening 10 of the housing 1, and the edge 101 of the housing 1 projects upwards in a suitable manner, beyond the counter pressure plate 2. The projecting edge 101 is desirable for the positioning of the counter pressure plate 2 and for the cooperation thereof in particular with the edge 111 of the cover 112.

Figure 5A:
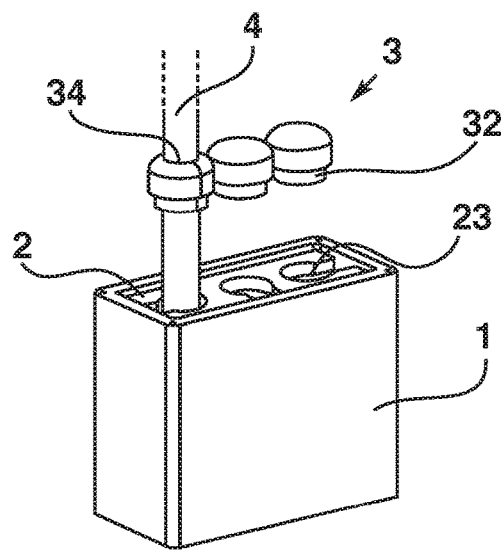
FIGS. 5a to 5d show further steps in the installation of the cable lead-through of FIG. 1.

FIGS. 5a to 5d show further steps of the installation of the cable lead-through of FIG. 1 following the steps of FIGS. 4a to 4d, wherein, in FIG. 5a, the cable 4 is inserted as intended into the axial cable passage 34 of a sealing element 3 via the slot 340 thereof. Since, in this embodiment, only one cable 4 is inserted into the housing 1 by way of example, the further similar sealing elements 3, for providing a suitable seal, are formed as filler plugs without a cable passage 34 and slot 340.

Figure 5B:
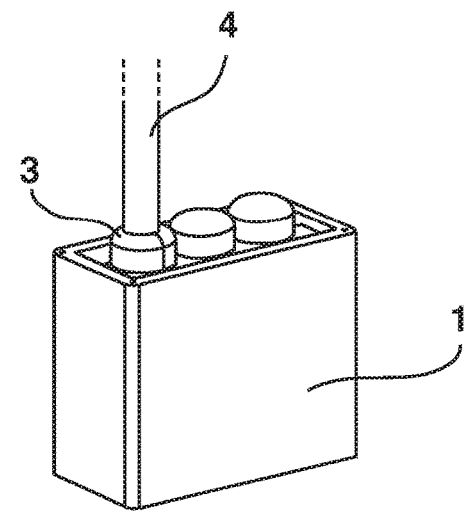

In FIG. 5b, the lower second cylinders 32 of the sealing elements 3 are inserted into their intended openings 23 of the counter pressure plate 2 with form fit, whereupon the undersides of the upper first cylinders 31 of the sealing elements 3 are supported on the counter pressure plate 2.

Figure 5C:
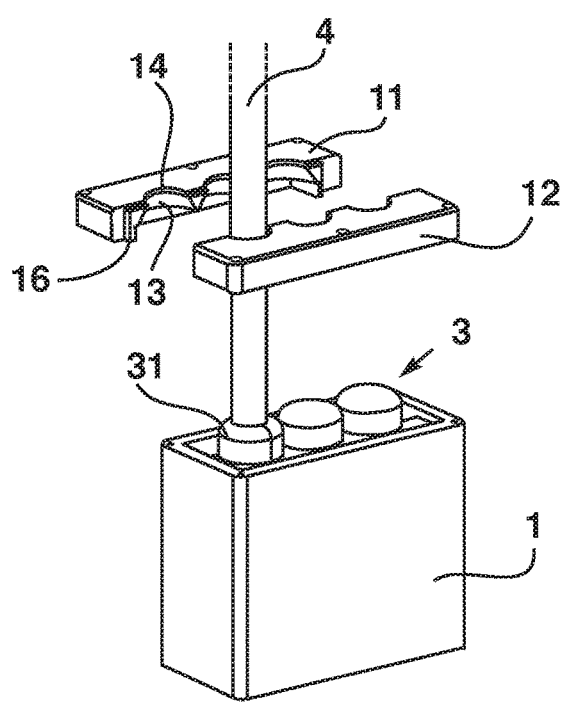
Figure 5D:
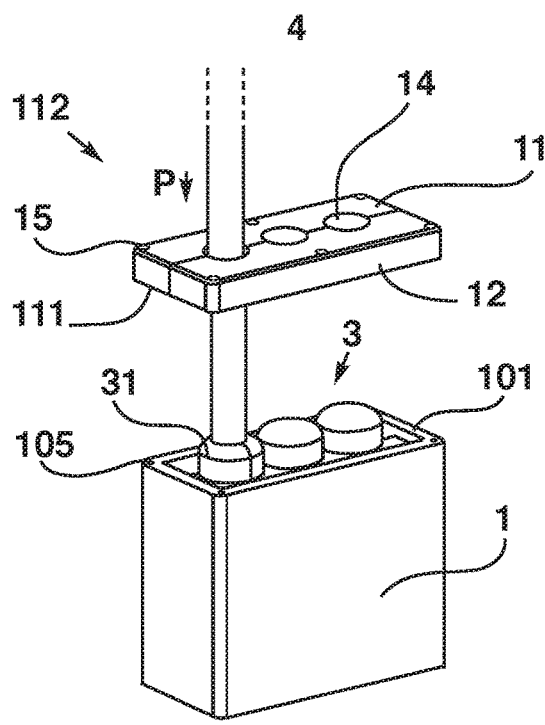

In FIG. 5c, the housing shells 11 and 12 are positioned in a suitable manner relative to the cable 4, so that they can be assembled to form the cover 112 of FIG. 5d, wherein their contours 16 engage with one another and the cable 4 is arranged in an opening 14 with its internal conical contour 13. The cover 112 is subsequently seated, under pressure, with its edge 111 on the edge 101 of the opening 10 of the housing 1, wherein a pressing force P is exerted on the first cylinder 31 of the elastic and/or flexible sealing elements 3, which is formed with a predetermined oversize, and results in the corresponding compression of said sealing elements and the development of their sealing effect.

Figure 6A:
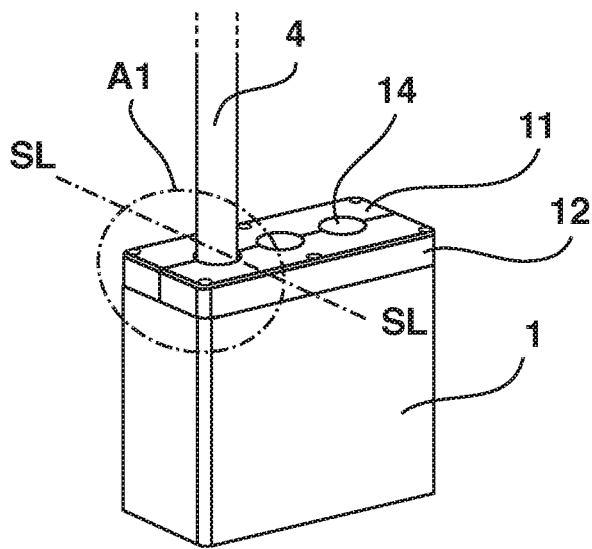
FIG. 6a shows the fully installed cable lead-through of FIG. 1.

The cover 112 is fixed on the housing 1 by way of suitable screws (not illustrated) via the bores 15 and 105 of the cover 112 and the housing 1, whereupon the fully installed cable lead-through of FIG. 6a is provided.

Figure 6B:
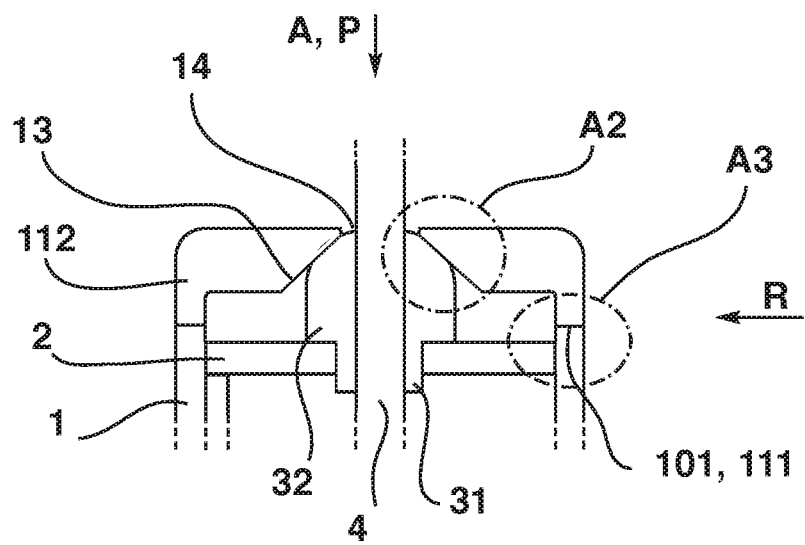
Figure 6C:
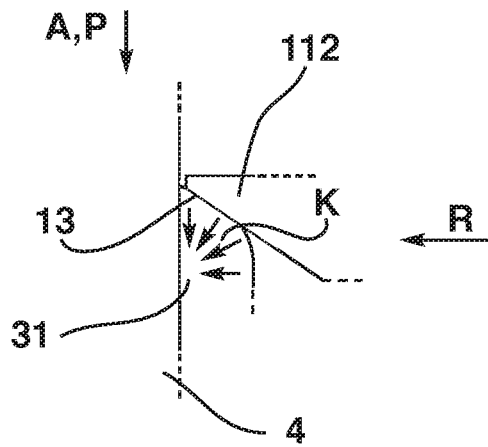
FIG. 6c shows an enlarged illustration of the detail A2 of FIG. 6b.

With reference to the description above of the installation of the cable lead-through referring to FIGS. 5d and 6a, FIG. 6b shows an enlarged illustration of the detail A1 of a longitudinal section through the line SL-SL of FIG. 6a, centrally along the axis of the cable 4, and FIG. 6c shows an enlarged illustration of the detail A2 of FIG. 6b.

During the installation of the assembled cover 112 on the housing 1, an axial pressure P is exerted on the flexible and/or elastic sealing element 3 from above, wherein this pressure P, in particular in cooperation with the internal cone 13 of the cover 112 and the rounding of the first cylinder 31, generates a compression K of the sealing element 3, advantageously both axially A and radially R, so that desirable sealing of the cover 112, the cable 4 in the cable passage 34 and the slot 340 is provided by way of the sealing element 3.

Figure 6D:
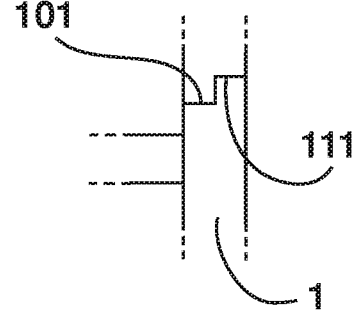
FIG. 6d shows an enlarged illustration of the detail A3 of FIG. 6b with a modified housing.

FIG. 6d shows an enlarged illustration of the detail A3 of FIG. 6b with a modified form of the edge 101 of the housing 1 on which the edge 111 of the cover 112 is seated, which is suitable for providing further desirable sealing of the housing 1, wherein the edge 101 and the edge 111 have mutually corresponding contours engaging with one another with form fit. Of course, a suitable sealing ring can also be provided in addition or alternatively to the above contour.

The above exemplary embodiments have been described by way of example with reference to a cable lead-through which is designed for a maximum of three cables 4 and accordingly has three sealing elements 3, etc. It is clear that further embodiments can also be designed for more or fewer cables 4.

Even where combinations of various aspects or features of the embodiments of the invention are shown in the figures in each case, it is clear to the person skilled in the art—unless indicated otherwise—that the combinations shown and discussed are not the only possible combinations. In particular, mutually corresponding units or feature complexes from different exemplary embodiments can be interchanged with one another.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A cable lead-through for leading at least one cable into a housing having an opening, which is equipped with a cover comprising at least two housing shells and having at least one opening, wherein:
    a separating plane of the housing shells extends centrally through the opening;
    to seal the housing, at least one sealing element is provided, which comprises a cable passage having a slot to a lateral edge thereof;
    a counter pressure plate comprising at least one cable passage and covering the opening is provided, which cooperates with the at least one sealing element and the cover to seal the housing; and
    the sealing element is arranged with a predetermined oversize between the cover and the counter pressure plate and is subjected to a pressing force, whereby the sealing element undergoes compression without a shear force occurring.

2. The cable lead-through as claimed in claim 1, wherein the at least one cable passage of the counter pressure plate comprises at least one continuous opening and at least one lateral cable inlet for lateral insertion of the cable into the at least one continuous opening.

3. The cable lead-through as claimed in claim 1, wherein a support, on which the counter pressure plate is supported, is formed on an inside of a wall of the housing in a vicinity of the opening of the housing.

4. The cable lead-through as claimed in claim 1 wherein the counter pressure plate is formed in one piece.

5. The cable lead-through as claimed in claim 2, wherein the counter pressure plate is formed in two pieces and is assembled from two substantially identically formed half plates, and wherein a separating plane of the counter pressure plate extends centrally through the at least one continuous opening of the at least one cable passage of the counter pressure plate.

6. The cable lead-through as claimed in claim 1, wherein the counter pressure plate is assembled from a plurality of individual plate elements, each having at least one cable passage.

7. The cable lead-through as claimed in claim 1, wherein the opening of the cover, starting from an edge of the opening, is internally widened in a cone shape, whereby a contour is provided, which cooperates with the sealing element in such a way that the sealing element undergoes an axial and radial compression under the pressing force, without a shear force occurring.

8. The cable lead-through as claimed in claim 1, wherein sides of the two housing shells which correspond to the separating plane of the housing shells are each formed as mutually corresponding contours, which engage with one another with a form fit in such a way that the cover is also sealed in a region of the separating plane.

9. The cable lead-through as claimed in claim 1, wherein the sealing element comprises a first cylinder having a first diameter and a second cylinder having a second diameter that is smaller than the first diameter, wherein the at least one cable passage is formed axially through the first and second cylinders and the slot extends to the lateral edge of the sealing element in a longitudinal direction through the first and second cylinder.

10. The cable lead-through as claimed in claim 9, wherein the first cylinder of the sealing element is supported against the counter pressure plate and is formed such that the first cylinder is rounded in a vicinity of the opening of the cover and a contour of the cover.

11. The cable lead-through as claimed in claim 9, wherein the second cylinder is arranged in an opening of the at least one cable passage of the counter pressure plate such that the second cylinder is in form fit with the opening.

12. The cable lead-through as claimed in claim 1, wherein the cable is a prefabricated electrical cable, which can be fitted with a plug.

13. The cable lead-through as claimed in claim 1, wherein:
- the housing is formed from plastic and/or metal and the cover is formed from plastic, and
- the sealing element is formed in one piece from a suitable flexible and/or elastic sealing material.

* * * * *